(12) United States Patent
Boureghda et al.

(10) Patent No.: US 11,699,632 B2
(45) Date of Patent: Jul. 11, 2023

(54) METHODS FOR ATTACHMENT AND DEVICES PRODUCED USING THE METHODS

(71) Applicant: ALPHA ASSEMBLY SOLUTIONS INC., South Plainfield, NJ (US)

(72) Inventors: Monnir Boureghda, East Stroudsburg, PA (US); Nitin Desai, Princeton Junction, NJ (US); Anna Lifton, Bridgewater, NJ (US); Oscar Khaselev, Monmouth Junction, NJ (US); Michael T. Marczi, Chester, NJ (US); Bawa Singh, Voorhees, NJ (US)

(73) Assignee: ALPHA ASSEMBLY SOLUTIONS INC., South Plainfield, NJ (US)

( * ) Notice: Subject to any disclaimer, the term of this patent is extended or adjusted under 35 U.S.C. 154(b) by 207 days.

(21) Appl. No.: 17/153,706

(22) Filed: Jan. 20, 2021

(65) Prior Publication Data
US 2021/0289680 A1 Sep. 16, 2021

Related U.S. Application Data

(63) Continuation of application No. 14/027,530, filed on Sep. 16, 2013, now Pat. No. 10,905,041, which is a
(Continued)

(51) Int. Cl.
*H05K 13/04* (2006.01)
*H01L 23/373* (2006.01)
*H01L 23/00* (2006.01)

(52) U.S. Cl.
CPC ............ *H01L 23/373* (2013.01); *H01L 24/29* (2013.01); *H01L 24/32* (2013.01); *H01L 24/83* (2013.01);
(Continued)

(58) Field of Classification Search
CPC .................................................. H05K 13/0465
(Continued)

(56) References Cited

U.S. PATENT DOCUMENTS

| 4,906,596 A | 3/1990 | Joslin et al. |
| 5,058,796 A | 10/1991 | Schwarzbauer |

(Continued)

FOREIGN PATENT DOCUMENTS

| EP | 1 684 340 A2 | 7/2006 |
| JP | H09326416 A | 12/1997 |

(Continued)

OTHER PUBLICATIONS

Mark Green, Organometallic based strategies for metal nanocrystal synthesis, Mar. 24, 2005, The Royal Society of Chemistry 2005, pp. 3002-3010.

(Continued)

*Primary Examiner* — Stanley Tso
(74) *Attorney, Agent, or Firm* — Stinson LLP

(57) ABSTRACT

Methods for attachment and devices produced using such methods are disclosed. In certain examples, the method comprises disposing a capped nanomaterial on a substrate, disposing a die on the disposed capped nanomaterial, drying the disposed capped nanomaterial and the disposed die, and sintering the dried disposed die and the dried capped nanomaterial at a temperature of 300° C. or less to attach the die to the substrate. Devices produced using the methods are also described.

28 Claims, 4 Drawing Sheets

Related U.S. Application Data continuation of application No. 12/175,375, filed on Jul. 17, 2008, now Pat. No. 8,555,491.

(60) Provisional application No. 60/950,797, filed on Jul. 19, 2007.

(52) U.S. Cl.
CPC .. *H05K 13/0465* (2013.01); *H01L 2224/2936* (2013.01); *H01L 2224/29101* (2013.01); *H01L 2224/29111* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/32225* (2013.01); *H01L 2224/8384* (2013.01); *H01L 2224/83192* (2013.01); *H01L 2224/83801* (2013.01); *H01L 2924/0102* (2013.01); *H01L 2924/0103* (2013.01); *H01L 2924/014* (2013.01); *H01L 2924/0104* (2013.01); *H01L 2924/0105* (2013.01); *H01L 2924/01006* (2013.01); *H01L 2924/01011* (2013.01); *H01L 2924/01013* (2013.01); *H01L 2924/01019* (2013.01); *H01L 2924/01029* (2013.01); *H01L 2924/0132* (2013.01); *H01L 2924/01033* (2013.01); *H01L 2924/01046* (2013.01); *H01L 2924/01047* (2013.01); *H01L 2924/01077* (2013.01); *H01L 2924/01078* (2013.01); *H01L 2924/01079* (2013.01); *H01L 2924/01082* (2013.01); *H01L 2924/10253* (2013.01); *H01L 2924/14* (2013.01); *H01L 2924/1461* (2013.01); *H01L 2924/203* (2013.01); *Y10T 29/4913* (2015.01); *Y10T 29/49133* (2015.01); *Y10T 29/49155* (2015.01); *Y10T 428/24893* (2015.01)

(58) Field of Classification Search
USPC .......................................................... 361/760
See application file for complete search history.

(56) References Cited

U.S. PATENT DOCUMENTS

| | | | |
|---|---|---|---|
| 5,814,401 A | 9/1998 | Gamota et al. | |
| 5,922,403 A | 7/1999 | Tecle | |
| 6,036,889 A | 3/2000 | Kydd | |
| 6,103,868 A | 8/2000 | Heath et al. | |
| 6,120,708 A | 9/2000 | Ohshita et al. | |
| 7,262,511 B2 | 8/2007 | Osako et al. | |
| 7,721,423 B2 | 5/2010 | Kim et al. | |
| 7,836,588 B2 | 11/2010 | Laksin et al. | |
| 7,926,176 B2 | 4/2011 | Huber et al. | |
| 2002/0098680 A1 | 7/2002 | Goldstein | |
| 2005/0127134 A1 | 6/2005 | Lu et al. | |
| 2006/0038304 A1* | 2/2006 | Osako | H01L 24/29 257/789 |
| 2006/0073667 A1 | 4/2006 | Li et al. | |
| 2006/0163744 A1* | 7/2006 | Vanheusden | B82Y 30/00 257/E21.174 |
| 2006/0186535 A1 | 8/2006 | Baker et al. | |
| 2006/0194920 A1 | 8/2006 | Capote et al. | |
| 2007/0221404 A1* | 9/2007 | Das | B23K 26/382 29/831 |
| 2007/0298244 A1 | 12/2007 | Yasuda et al. | |
| 2008/0032047 A1 | 2/2008 | Parashar et al. | |
| 2008/0160183 A1 | 7/2008 | Ide et al. | |
| 2009/0020856 A1 | 1/2009 | Collins et al. | |
| 2009/0236404 A1 | 9/2009 | Yamakawa et al. | |

FOREIGN PATENT DOCUMENTS

| | | | |
|---|---|---|---|
| JP | 2001119130 A | 4/2001 | |
| JP | 2002126869 A | 5/2002 | |
| JP | 2004130371 A | 4/2004 | |
| JP | 2005081501 A | 3/2005 | |
| JP | 2006083377 A | 3/2006 | |
| JP | 2006118010 A | 5/2006 | |
| JP | 2006169592 A | 6/2006 | |
| JP | 2006523760 A | 10/2006 | |
| JP | 2007095510 A | 4/2007 | |
| JP | 2007109833 A | 4/2007 | |
| WO | 2004/026526 A1 | 4/2004 | |
| WO | 2006/113719 A2 | 10/2006 | |
| WO | 2007/034844 A1 | 3/2007 | |
| WO | WO2007/034833 | * | 4/2007 |
| WO | 2007/081037 A1 | 7/2007 | |

OTHER PUBLICATIONS

Junji Haruyama, Izumi Takesue, and Tetsuro Hasegawa, Injection of Polarized Spins and Anti-Localization Caused by Slight Doping of Heavy Impurities Into One End of Carbon Nanotubes, 2002, Materials Research Society, vol. 706, pp. Z6.4.1-Z6.4.6.

Kobayashi, Koujirou. "New Joining Method Using Silver Nano-Particles." Metal, Japan, Sep. 1, 2005, vol. 75, No. 9, p. 61-66.

Bai G., "Low-Temperature Sintering of Nanoscale Silver Paste for Semiconductor Device Interconnection," Dissertation, Oct. 2005, 215 pages.

* cited by examiner

METHODS FOR ATTACHMENT AND DEVICES PRODUCED USING THE METHODS

REFERENCE TO RELATED APPLICATIONS

This application is a continuation of U.S. patent application Ser. No. 14/027,530 filed Sep. 16, 2013, which is a continuation of U.S. patent application Ser. No. 12/175,375 filed Jul. 17, 2008, now U.S. Pat. No. 8,555,491, which claims priority to U.S. Provisional Application Ser. No. 60/950,797 filed on Jul. 19, 2007, the entire disclosures of which are hereby incorporated herein by reference for all purposes.

FIELD OF THE INVENTION

Certain embodiments disclosed herein relate generally to methods for attachment of an electronic component to a substrate. More particularly, certain examples are directed to methods of die attachment using temperatures less than or equal to 300° C. and to devices made using such methods.

BACKGROUND

In attaching dies to substrate, a joint or electrical coupling is used between the die and the substrate. In preparing the joint, high temperatures exceeding 300° C. may be used. Such high temperatures can damage the sensitive dies leading to devices with poor performance or limited lifetimes.

BRIEF SUMMARY OF THE INVENTION

Certain features, aspects and examples described below are directed to joints that can function and/or operate at temperatures of 200° C. or more. Conventional solder which is typically a tin alloy will quickly fail at this temperature since tin is a low melting point metal. Embodiments of the joints described herein can operate at such high temperatures by including silver, which melts at 900° C. In some aspects, a process of sintering silver nanopowder with certain amounts of capping agent at temperatures less then 300° C. may be used to provide the joint. As discussed further below, the selected amount of capping provides a high density silver joint and can prevent silicon die cracking during pressure sintering.

In a first aspect, a method of attaching an electronic component to a substrate is disclosed. In certain examples, the method comprises disposing a capped nanomaterial on a substrate, disposing an electronic component on the disposed capped nanomaterial, drying the disposed capped nanomaterial and the disposed electronic component, and sintering the dried disposed electronic component and the dried capped nanomaterial at a temperature less of 300° C. or less to attach the electronic component to the substrate. In some examples, the electronic component may be a die.

In certain embodiments, the capped nanomaterial may comprise silver particles capped with a capping agent, wherein the capping agent is present at about 0.2 weight percent to about 15 weight percent based on the weight of the capped silver particles and more particularly is present from about 1.5-2.5 weight percent. In some embodiments, the method may further comprise dispersing the capped silver particles in a solvent prior to disposition of the capped silver particles on the substrate. In other embodiments, the method may further comprise removing the capping agent from the capped silver particles during the sintering step. In some examples, the capped nanomaterial may comprise capped metal particles, wherein the metal of the capped metal particles is selected from the group consisting of gold, silver, copper, nickel, platinum, palladium, iron, and alloys thereof. In certain examples, the drying and the sintering steps are both performed at 300° C. or less. In some embodiments, the sintering step may be performed under a nitrogen atmosphere. In certain examples, the nitrogen atmosphere provides a pressure substantially equal to atmospheric pressure. In other examples, the pressure may be above atmospheric pressure, for example, from about 0.2-20 MPa or about 5 MPa. In other examples, the drying step may be performed at a pressure less than atmospheric pressure.

In another aspect, a device comprising a substrate, an electronic component disposed on the substrate, and an electrical joint between the electronic component and the substrate, the electrical joint comprising a nanomaterial sintered at a temperature of 300° C. or less to provide electrical coupling between the substrate and the electronic component is provided. In certain examples, the electronic component may be a die.

In certain embodiments, the substrate may be a printed circuit board and the nanomaterial comprises capped silver particles. In some embodiments, the capped silver particles comprise about one weight percent to about 15 weight percent capping agent, based on the weight of the capped silver particles, prior to formation of the joint. In other examples, the nanomaterial may comprise metal particles, wherein the metal of the metal particles is selected from the group consisting of gold, silver, copper, nickel, platinum, palladium, iron, and alloys thereof. In some examples, the electrical joint may have a substantially uniform thickness between the die and the substrate. In certain examples, the electrical joint may be substantially void free.

In an additional aspect, a kit for producing an electrical joint, the kit comprising a nanomaterial comprising capped metal particles including about one weight percent to about 15 weight percent capping agent, based on the weight of the nanomaterial, and instructions for using the nanomaterial to provide an electrical joint between a substrate and an electronic component disposed on the substrate is disclosed.

In certain embodiments, the kit may further comprise an electronic component, for example a die, for use with the nanomaterial. In other embodiments, the kit may further comprise a substrate for use with the die and the nanomaterial. In some embodiments, the substrate may be a printed circuit board.

In another aspect, a method facilitating electrical coupling of an electronic component and a substrate, the method comprising providing a nanomaterial effective to provide an electrical joint between the electronic component and the substrate after sintering of the nanomaterial at a temperature of 300° C. or less. In certain examples, the electronic component may be a die.

In certain embodiments, the nanomaterial may be effective to provide an electrical joint between the electronic component and the substrate after sintering at a pressure less than atmospheric pressure. In some embodiments, the nanomaterial comprises capped silver particles having about one weight percent to about 15 weight percent capping agent, based on the weight of the capped silver particles. In some examples, the nanomaterial may comprise metal particles, wherein the metal of the metal particles is selected from the group consisting of gold, silver, copper, nickel, platinum, palladium, iron, and alloys thereof. In other examples, the metal particles may be capped with a capping agent selected from the group consisting of thiols and amines.

Additional aspect, embodiments, examples and features are described in more detail below.

BRIEF DESCRIPTION OF FIGURES

Certain illustrative embodiments, features and aspects are described in more detail below with reference to the accompanying figures in which.

Figure 1:
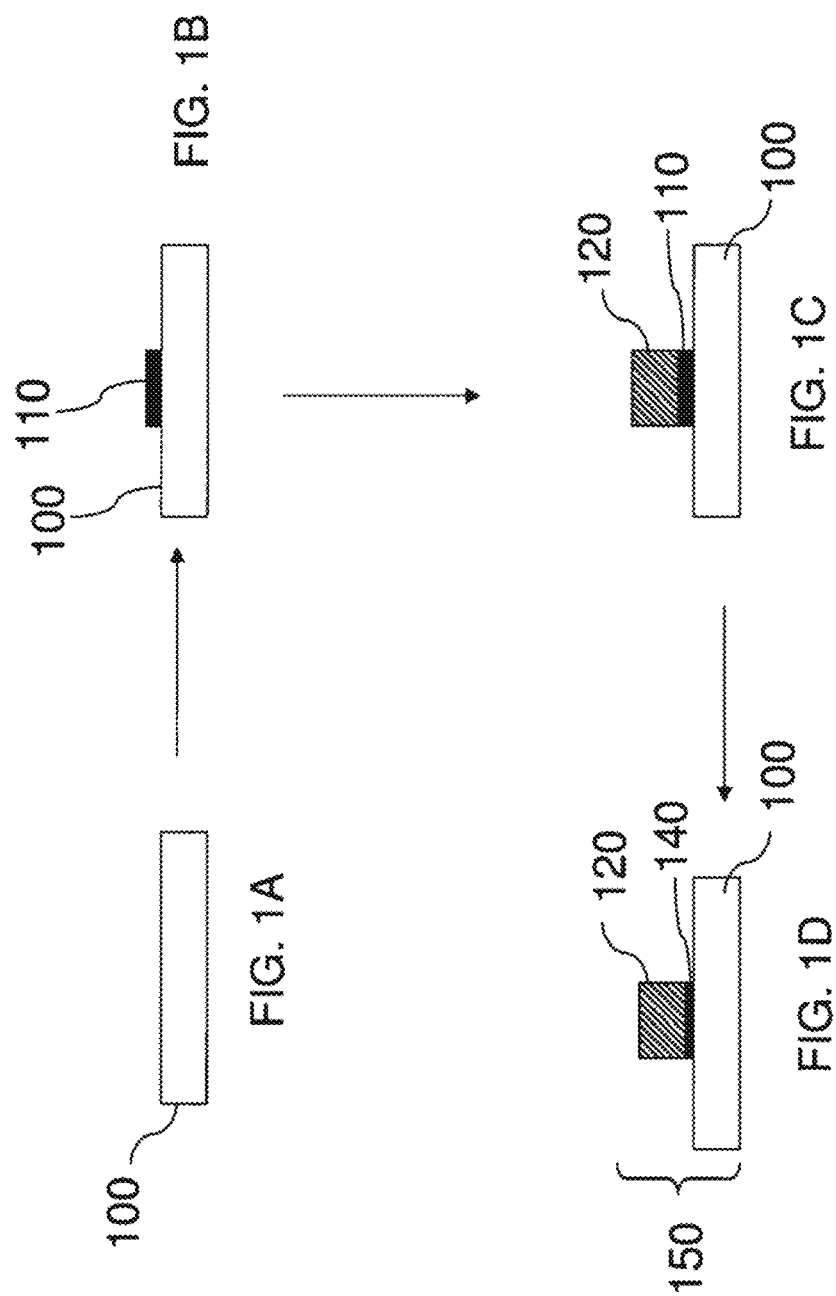
FIGS. 1A-1D are schematics of a method for producing an electrical joint between an electronic component and a substrate, in accordance with certain examples.

The dimensions of certain components in the figures, relative to the dimensions of other components in the figures, have been intentionally distorted, enlarged or shrunken to facilitate a better understanding of the technology described herein. For example, the thickness of the joint, the dimensions of the electronic component and/or the dimensions of the substrate have been intentionally shown out of proportion to each other to provide a more user friendly description. Illustrative dimensions and thickness of the components shown in the figures are described in more detail below.

DETAILED DESCRIPTION

Certain embodiments described herein are directed to materials and devices for use in attaching electronic component, including but not limited to dies, to selected substrates (or areas thereof) including, but not limited to, pre-pregs, printed circuit boards In a typical die attach process, silicon die is attached to substrates and electrically connected before being encapsulated or sealed for protection. To avoid damaging the device attachment temperature is typically below 300° C. There are two types of die-attach materials that are widely used today in electronic packages—solder alloys and polymer-matrix composites. Both materials have a low processing temperature but relatively low thermal and electrical conductivities. Dies attached with these materials reliably serve at operating temperatures below 125° C. For higher operating temperatures dies are normally attached using high temperature solders (i.e. AuSn) or silver-glass containing composites. These materials require high processing temperatures which generate high mechanical stresses in devices, and also the materials have relatively low thermal and electrical conductivities.

Silver has high electrical and thermal conductivity and is an attractive die-attach material which can replace solder alloys and composite materials for packaging power semiconductors. While the operating temperature of a solder is limited by its melting point, the sintered silver joint can be used above the sintering temperature, enabling high-performance devices to operate at high temperature. Both micron size and nano-size silver powder were used to formulate printable paste for die attachment. Devices assembled with the silver paste demonstrated high reliability in power electronic application. The typical attachment procedure consist of Ag paste stencil printing followed by sintering at temperature ~300° C. and pressure of about 30-40 MPa. Applied pressure is required to assure sintering of silver powder at such low temperatures and also to provide good bonding of the Ag interconnect to the substrates. Application of such high pressure complicates the attachment process and also can cause damage to the silicon device.

Certain features, aspects and examples disclosed herein are directed to attach processes which utilize specially formulated nano-materials such as nano-silver paste and allows attachment of an electronic component, for example a silicon die, to the substrate at temperatures of 300° C. or below and/or at zero or pressures less than atmospheric pressure. These materials are referred to in certain instances below as "nanomaterials." Illustrative nanomaterials are disclosed in commonly assigned U.S. patent application Ser. No. 11/462,089 filed on Aug. 3, 2006, the entire disclosure of which is hereby incorporated herein by reference for all purposes. The nanomaterials suitable for use in the devices and methods described herein may include one or more types of metal particles capped with a selected amount of a capping agent.

In certain examples, the use of a single phase solution to produce the particles for use in the attach processes permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, the metal used to provide the particles for use in the attach processes may be uncomplexed or may be complexed with one or more ligands. For example, the metal may be complexed with EDTA, ethylenediamine, oxalate, 2,2'-bypyridine, cyclopentadiene, diethylenetriamine, 2,4,6,-trimethylphenyl, 1,10-phenanthroline, triethylenetetramine or other ligands. In certain examples, the metal or metal salt may be dissolved in a solvent or a solvent system to provide a clear, but not necessarily colorless, solution. For example, a suitable amount of metal or metal salt may be added to a solvent such that when the metal or metal salt goes into solution, the overall solution is clear. The overall solution may be colored or may be colorless. Suitable solvents include, but are not limited to, ethylene glycol, methanol, ethanol, propanol, isopropanol, butanol, isobutyl alcohol, pentanol, isopentanol, hexanol and aliphatic alcohols having from about 1 to about 10 carbon atoms. Additional suitable solvents include, but are not limited to, benzene, toluene, butylenes, polyisobutylene, Isopar® solvents commercially available from Exxon and aromatic compounds having aliphatic side chains that include 2-6 carbon atoms. Suitable solvent systems include mixtures of the illustrative solvents discussed herein and other fluids that are soluble, miscible or partially miscible with such illustrative solvents. In certain examples, the combination of solvents provides a single phase. To achieve a single phase when using a mixture of solvents, the amounts of each solvent may be adjusted such that a single phase results when the solvents are mixed. Should more than one phase be present upon mixing, the relative amounts of one or more of the solvents can be altered, for example, increased or decreased, until a single phase is observed.

In accordance with certain examples, the metal particles may be mixed with a capping agent. The capping agent may be effective to isolate the particle and limit the size of its growth. In certain examples, the capping agent may be a high molecular weight capping agent, for example, has a molecular weight of at least about 100 g/mol. Illustrative capping agents include, but are not limited to, organic amines having 12 or more carbon atoms. In certain examples, the organic amine has at least 16 carbon atoms, for example, hexadecylamine. The organic moiety of the amine may be saturated or unsaturated and may optionally include other functionalities such as, for example, thiols, carboxylic acids, polymers, and amides. Another group of illustrative capping agents suitable for use with the metals of the materials disclosed herein are thiols having 12 or more carbon atoms. In certain examples, the thiol has at least 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like. Additional suitable capping agents will be readily selected by the person of ordinary skill in the art, given the benefit of this disclosure.

In certain examples where a capping agent is used with metal particles to provide a material for use in a attach processes, the capping agent may be dissolved in a suitable solvent prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step. In certain examples, the exact amount of capping agent added to the metal solution may vary depending on the desired properties of the resulting capped particles. In some examples, a suitable amount of capping agent is added to provide at desired amount of capping agent by weight in the capped particles. Such desired weighs of capping agent for materials useful in an attach process are discussed in more detail below. It will be recognized by the person of ordinary skill in the art, given the benefit of this disclosure, that it may be desirable to use more or less capping agent depending on the desired properties of the resulting material. For example, to increase the conductivity of particles disposed on a substrate, for example, a printed circuit board, it may be desirable to adjust the amount of capping agent until the conductivity (or other physical properties) is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution could be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure. In certain examples, the capping agent and the metal solution may be mixed using conventional techniques such as stirring, sonication, agitation, vibration, shaking or the like. In some examples, the capping agent may be added to the metal solution while the metal solution is being stirred. In certain examples, the mixture of capping agent and metal solution may be stirred until a clear and/or colorless single phase solution results.

In accordance with certain examples, a reducing agent may be added to the metal-capping agent solution prior to, of after, deposition on a substrate. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo) dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, for example, $Ag^{+1}$ may be converted to $Ag^0$ or $Cu^{+2}$ may be converted to $Cu^0$. In some examples, the reducing agent may be dissolved in a solvent prior to addition to the metal-capping agent solution, whereas in other examples, the reducing agent may be added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms, for example, linear, cyclic or aromatic solvents having six or more carbon atoms. The person of ordinary skill in the art, given the benefit of this disclosure, will be able to select suitable solvents for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, for example, about 30° C. to about 70° C., to speed the reduction process. When an elevated temperature is used, it may be desirable to keep the temperature below the boiling point of the solvent or solvent system to reduce the likelihood of solvent evaporation, though in some examples, it may be desirable to reduce the overall volume of solvent.

In accordance with certain examples, the metal particles may be isolated from the single phase solution prior to deposition on a substrate. Isolation may occur, for example, by decanting, centrifugation, filtering, screening or addition of another liquid that the capped metal particles are insoluble in, for example, extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, for example, if the metal particles are produced in about five Liters of solvent, then about 20 Liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein. In other examples, the capped metal particles may remain in a single phase solution and the particles may be disposed on a silicon substrate (or other suitable substrate) in, for example, a mold, form or pattern on the substrate. The high temperatures of the sintering process results in evaporation of the solvent and sintering of the metal particles, which can provide a metallurgical bond to enhance adhesion of the conductor to the substrate.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry. In an alternative embodiment, a separate drying step may be omitted, and the particles may be dried during the sintering process.

In accordance with certain examples, the capped particles may be processed to remove the capping agent prior to use. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, for example, the capping agent is present at about 1.5-2.5% by weight. In some examples, the capping agent may be removed to provide a substantially pure metal, for example, substantially pure silver, that may be deposited on the substrate.

In certain embodiments, the exact metal used to provide a nanoink may vary, for example, conductive metals or conductive metal salts including, but not limited to, transition metals or transition metal salts of gold, silver, copper, nickel, platinum, palladium, iron, and alloys thereof may be used. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Other suitable metals salts for use in producing a nanoink suitable for attaching an electronic component to the substrate, will be readily selected by the person of ordinary skill in the art, given the benefit of this disclosure.

Certain embodiments of the capped materials used herein are selected to include a desired amount of capping agent so that processing of the material does not result in a poorly resulting final product or electrical joint between the electronic component and the substrate. For example, the amount of capping agent may be selected to provide a joint or coupling that has low voids, high conductivity and little or no discontinuities. Certain embodiments disclosed herein use the advantageous feature of capped materials having a selected amount of capping agent to wet and adhere to the solid surfaces during sintering process at temperatures of 200-300° C., for example.

In certain examples where a capped material is used in an attach process, the weight percent of capping agent in the material may vary with the type of capping agent and/or the desired joint. For example, material with little or no capping agent may not adhere effectively to a substrate material such as silicon. It may be difficult to sinter structures formed from a capped material with levels of capping agent too low without applying substantial external pressures. Too much capping agent may also have undesirable effects on the resulting joint. For example, if the amount of capping agent is too high, the rapid release of the organic substances during sintering may cause sintered structures to be porous and mechanically inferior. In examples where hexadecylamine (HDA) is used, the level of capping agent may be about 10-14% weight percent in the resulting material. Where other capping agents are used, the weight percent of the capping agent may vary with illustrative ranges being about 1-10% by weight for pyridine based capping agents and about 1-15% by weight for thiol capping agents.

In certain embodiments, the nanomaterials described herein may be used to provide an electrical joint between an electronic component such as, for example, a die, and a substrate. A first illustrative method is shown in FIGS. 1A-1D. For illustrative purposes only, reference is made to the electronic component as shown in the figures as being a die, though other suitable electronic components may also be used, as discussed further below. Referring to FIGS. 1A and 1B, a nanomaterial 110 is disposed on a substrate 100. As used herein "dispose" refers to depositing, coating, brushing, painting, printing, stenciling or otherwise placing a material on another material or substrate. The exact methodology used to dispose the nanomaterial may vary and illustrative methods include, but are not limited to, ink-jet printing, stencil printing, coating, brushing, spin coating, vapor deposition and the like. In some instances the entire surface of a substrate may be coated with the nanomaterial, one or more die may be placed at a desired site and the remaining material may be later removed or etched away from the substrate. In other examples, the nanomaterial may only be disposed at selected areas of sites where a die is to be attached.

In certain embodiments, the nanomaterial may be disposed on the substrate to a thickness of about 10 microns to about 200 microns, more particularly about 25 microns to about 75 microns. The nanomaterial may be disposed at a substantially uniform thickness or certain areas may have an increased (or decreased) thickness compared to other areas. For example, it may be desirable to select a first thickness for a first type of electronic component to be attached to a substrate and a second thickness for a different type of electronic component to be attached to the substrate.

In some examples, prior to disposition of a dye, a solder flux or other material may be deposited on the substrate to remove any oxidation from the substrate surface during processing of the components. Illustrative fluxes include but are not limited to, those described in commonly assigned PCT Application No. PCT/US2007/81037 entitled "Flux Formulations," the entire disclosure of which is hereby incorporated herein by reference. In other examples, however, the nanomaterial itself has suitable properties to remove oxidation from the surface of the substrate (or prevent oxidation from occurring) such that no flux or other material is required.

Illustrative dimensions for a substrate suitable for use with the methods and kits disclosed herein include, but are not limited to, those having a length of about 0.1 cm to about 2 cm, a width of about 0.1 cm to about 2 cm, and a thickness of about 0.01 mm to about 0.5 mm. The dies used in the processes and kits disclosed herein typically include semi-conducting materials (or other conductive materials) that may be placed on a selected portion of a substrate. Die may be produced, for example, using suitable wafer fabrication processes including, but not limited to, wafer mounting and semi-conducting-die cutting to provide a plurality of dies each containing one or more integrated circuits. Illustrative other electronic components that may be attached using the materials and devices disclosed herein include, but are not limited to, a copper heat spreader, silver or gold wires, LED's, MEMS and other components that may be attached to a circuit board or a substrate.

After disposition of the nanomaterial 110, an electronic component 120 may then be disposed on the disposed nanomaterial 110 (see FIG. 1C). Such disposition may occur using manual placement, automated pick-and-place equipment or other suitable devices that can, for example, place an electronic component at a desired site or area on a printed circuit board. The electronic component 120 is typically placed on the disposed nanomaterial 110 without the use of external force or pressure. Prior to sintering, the electronic component 120 may be held in place by contact with the nanomaterial 110.

After disposition of the electronic component 120, the overall assembly may be sintered such that the nanomaterial 110 is cured to provide an electrical joint between the electronic component 120 and the substrate 110 (see FIG. 1D). During the sintering process, the thickness of the nanomaterial 110 generally decreases. Sintering is desirably performed at a temperature to provide a suitable electrical joint but not so high that damage to the electronic component may occur. For example, the nanomaterials described herein permit sintering at temperatures of 300° C. or less to provide an electrical joint with substantially uniform thickness and low or no voids. By using temperatures of 300° C. or less, the likelihood of potential damage to the electronic component is reduced. Sintering may take place by application of heat to the entire assembly or heat that is focused at the particular electronic component-nanomaterial-substrate site. In some examples, the entire device may be placed in an oven. Other suitable devices for sintering include but are not limited to, a copper heat spreader, silver or gold wires, LED's, MEMS, etc. In some embodiments, sintering may be performed at a pressure from about 0.2-20 MPa, for example about 5 MPa.

In certain examples, the assembly may be sintered using a selected temperature profile for a selected period. The temperature profile of the sintering may be linear, stepped or other suitable temperature profiles. For example, the temperature may be cycled between a first sintering temperature and a second sintering temperature multiple times during the sintering step. As a result of the sintering, an electronic assembly 150 (FIG. 1D) is produced where the assembly includes an electronic component 120, a substrate 110 and an electrical joint 140 between them. The electronic assembly may undergo further processing including, but not limited to, the placement of additional electronic components on the substrate, heating, drying, further sintering and other processing steps commonly implemented in the production of electronic devices such as, for example, printed circuit boards.

Figure 2:
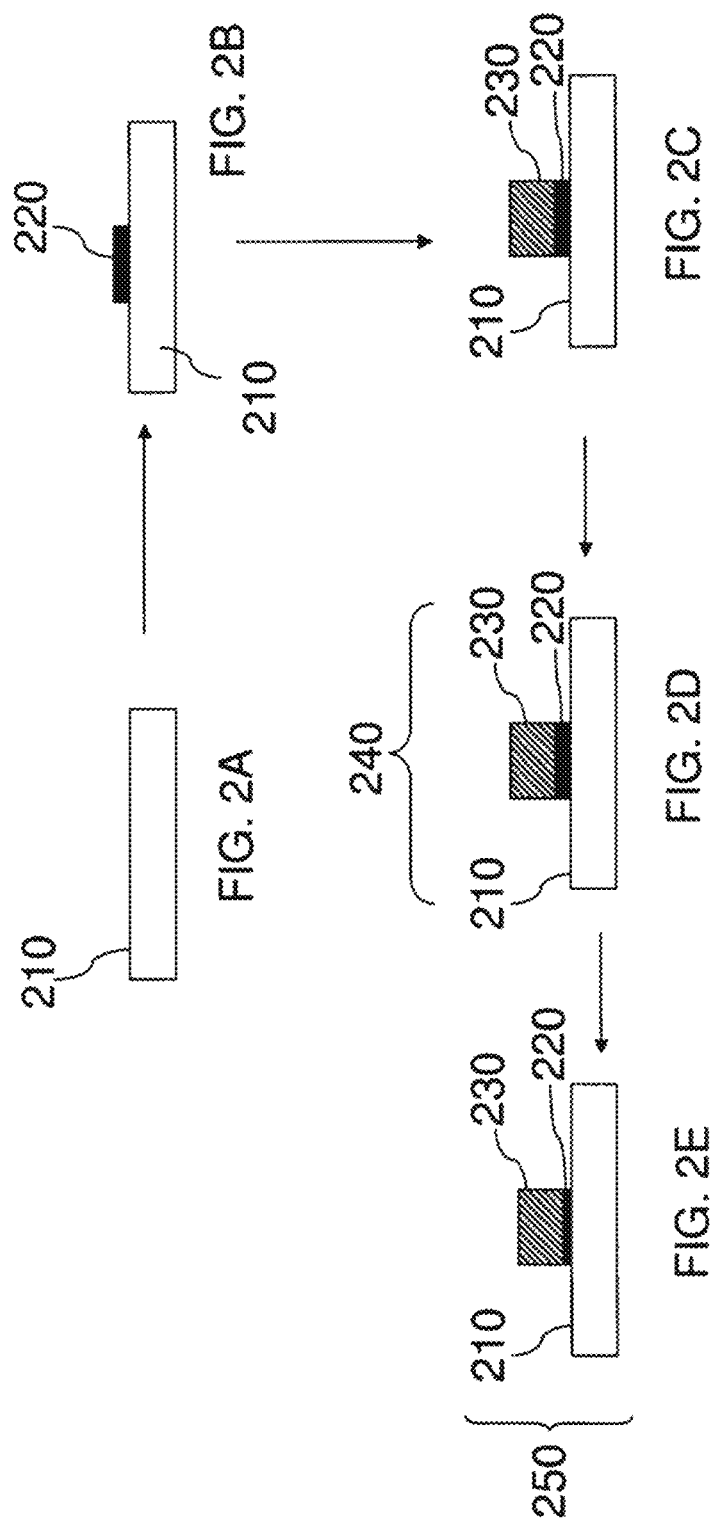
FIGS. 2A-2E are schematics of another method for producing an electrical joint between an electronic component and a substrate, in accordance with certain examples.

In certain examples, during production of the assembly, one or more drying steps may be implemented. The drying may be used, for example, to remove solvents and surfactants before the sintering step. The drying may be performed before placement of the die on the substrate or after placement of the die on the substrate. For example and referring to FIGS. 2A-2E, an electronic assembly may be produced by disposing a nanomaterial 220 on a substrate 210. Such disposition may occur using any of the illustrative methods disclosed herein or other suitable methods. While not shown, the substrate may be dried prior to the placement of the electronic component shown in 230. An electronic component 230 may be disposed on the nanomaterial 220 (see FIG. 2C). The electronic component-nanomaterial-substrate assembly may optionally be dried (see FIG. 2D) at a suitable temperature and using suitable devices. The assembly 240 may then be sintered at a sintering temperature to provide a sintered assembly 250.

In certain examples, the drying temperature may range from about 5° C. to about 200° C., more particularly about 120° C. to about 160° C., and is typically less than the sintering temperature. Heat guns, ovens, IR lamps, hot plates and other devices that can provide heat may be used to dry the components. In some examples, the assembly may be dried in on oven at a first temperature and then may be sintered in the same oven at a second temperature. In other examples, drying may be performed at a pressure less than atmospheric pressure. In some examples, two or more drying steps may be performed. For example, a first drying step may be performed at a first temperature, e.g., the substrate may be dried prior to placement of the electronic component on the substrate, followed by a second drying step at a second temperature, which may be greater than or less than the temperature of the first drying step.

In certain embodiments, by drying and sintering the electronic assembly, low voids or substantially no voids may be present in the sintered nanomaterial. Void formation in the nanomaterial can reduce the overall integrity of the electrical joint and result in poor performance. In some examples, a pressure less than atmospheric pressure may be used to further reduce the likelihood that void formation may occur.

Certain specific examples are described in more detail below to illustrate further some of the novel features of the technology described herein.

Example 1

A nanosilver paste comprising capped silver particles was prepared as described in U.S. application Ser. No. 11/462,089. In brief, the composition of the silver paste was 80 weight percent nanosilver powder with amounts of hexadecylamine capping agent ranging from Oto 15 weight percent. Butyl carbitol was used as a solvent (present at 19.5 weight percent in the paste), and a surfactant BYK 163 (0.5 weight percent in the paste) was also present. The composition was mixed in high speed mixer SpeedMixer DAC 150 FVZ-K at 2500 rpm for 1 min and then milled in 3-roll mill from EXAKT. The resulting material was used to wet and adhere to the solid surfaces during sintering processing at temperatures of 200-300° C.

Experiments performed using the silver nanopowder with different amounts of a hexadecylamine capping agent revealed that the nanomaterial that included no or minimal amounts of capping agent did not adhere to silicon or any other material. It also could not be sintered into dense structures without applying significant external pressures. Experiments performed using silver nanopowder with high levels of capping agent (for example, 10% by weight or more) also provided less than desired results. At high capping agent levels, the rapid release of the organic substances during sintering may cause the sintered structures to be porous and mechanically inferior.

From the experiments, it was found that for hexadecylamine (HAD) capped silver nano-powders, a desirable amount of capping agent that provided desirable properties was in the range of about 1.5-2.5 weight percent, based on the weight of the capped silver nano-powder.

Example 2

A paste was prepared having the following components: 70 weight percent nano-silver powder (capped with 2 weight percent HDA, based on the weight of the capped silver nano-powder), 15 weight percent butyl carbitol, 2 weight percent toluene, 0.75 weight percent dispersing agent Dysperbyk 163, and 0.5 weight percent wetting agent Sylquest Al 100.

The paste was stencil printed on a 25 mm by 25 mm alumina direct bond copper (DBC) substrate from Curamic Electronics. The stencil thickness was 150 microns and opening was 20×20 mm. The silicon die 15×15 mm having a sputtered nickel/gold metallization layer was placed on the surface of the silver printed layer. The assembly was processed according to the following conditions: drying at 50° C. for 5 min., then at 140° C. for 30 min. and final sintering at 300° C. for two min. and at a pressure of 5 MPa.

Figure 3:
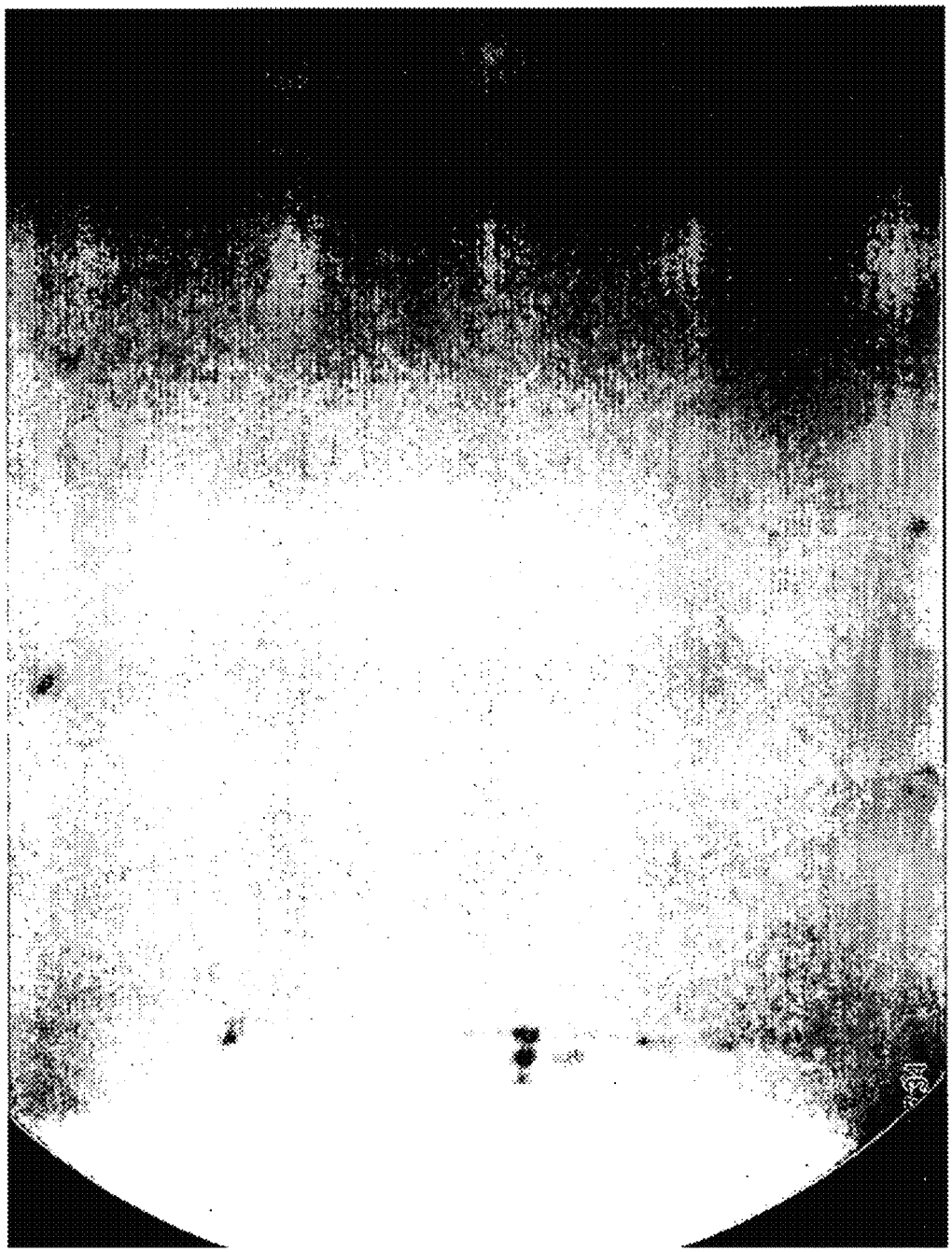
FIG. 3 is an X-ray a die attached to a copper heat sink, in accordance with certain examples.
Figure 4:
FIG. 4 is an SEM image showing a cross-section of a nano-silver joint, m accordance with certain examples.

The formed joints were examined for voiding by X-ray (see FIG. 3 for an X-ray of a die attached to a copper heat sink) and by SEM observation of the cross-section (see FIG. 4 showing a cross-section of a nano-silver joint). No voiding was observed.

The reliability of the silver joint was investigated in the thermal shock test between temperatures −50° C. and +125° C. The joint formed with the nano-silver paste successfully passed over 700 cycles.

Example 3

A nanogold paste comprising capped gold particles may be prepared as described in U.S. application Ser. No. 11/462,089. The paste may include gold particles capped with about 1-2% by weight capping agent. The capping agent may be hexadecylamine, dodecanethiol or other amine-based or thiol-based capping agents. The nanogold paste may be used to attach a die (or other electronic component) to a substrate.

Example 4

A nanoplatinum paste comprising capped platinum particles may be prepared as described in U.S. application Ser. No. 11/462,089. The paste may include platinum particles capped with about 1-2% by weight capping agent. The capping agent may be hexadecylamine, dodecanethiol or other amine-based or thiol-based capping agents. The nanoplatinum paste may be used to attach a die (or other electronic component) to a substrate.

Example 5

A nanopalladium paste comprising capped palladium particles may be prepared as described in U.S. application Ser. No. 11/462,089. The paste may include palladium particles capped with about 1-2% by weight capping agent. The capping agent may be hexadecylamine, dodecanethiol or other amine-based or thiol-based capping agents. The nanopalladium paste may be used to attach a die (or other electronic component) to a substrate.

Example 6

A nanocopper paste comprising capped copper particles may be prepared as described in U.S. application Ser. No. 11/462,089. The paste may include platinum particles capped with about 1-2% by weight capping agent. The capping agent may be hexadecylamine, dodecanethiol or other amine-based or thiol-based capping agents. The nanocopper paste may be used to attach a die (or other electronic component) to a substrate. In the attachment process, one or more of the sintering and/or drying steps may be performed in a nitrogen atmosphere.

Example 7

A nanosilver-nanocopper paste comprising silver particles and copper particles may be prepared as described in U.S. application Ser. No. 11/462,089. The paste may include silver particles capped with about 1-2% by weight capping agent or copper particles capped with about 1-2% by weight capping agent or both. The capping agent may be hexadecylamine, dodecanethiol or other amine-based or thiol-based capping agents. The nanosilver-nanocopper paste may be used to attach a die (or other electronic component) to a substrate. The nanosilver-nanocopper particles may be present in a ratio of 1:1, 2:1, 1:2, respectively, or any ratio in between these ratios. In the attachment process, one or more of the sintering and/or drying steps may be performed in a nitrogen atmosphere.

Example 8

A nanosilver-nanogold paste comprising silver particles and gold particles may be prepared as described in U.S. application Ser. No. 11/462,089. The paste may include silver particles capped with about 1-2% by weight capping agent or gold particles capped with about 1-2% by weight capping agent or both. The capping agent may be hexadecylamine, dodecanethiol or other amine-based or thiol-based capping agents. The nanosilver-nanogold paste may be used to attach a die (or other electronic component) to a substrate. The nanosilver-nanogold particles may be present in a ratio of 1:1, 2:1, 1:2, respectively, or any ratio in between these ratios.

Example 9

A nanosilver-nanoplatinum paste comprising silver particles and platinum particles may be prepared as described in U.S. application Ser. No. 11/462,089. The paste may include silver particles capped with about 1-2% by weight capping agent or platinum particles capped with about 1-2% by weight capping agent or both. The capping agent may be hexadecylamine, dodecanethiol or other amine-based or thiol-based capping agents. The nanosilver-nanogold paste may be used to attach a die (or other electronic component) to a substrate. The nanosilver-nanoplatinum particles may be present in a ratio of 1:1, 2:1, 1:2, respectively, or any ratio in between these ratios.

Example 10

A nanosilver-nanopalladium paste comprising silver particles and palladium particles may be prepared as described in U.S. application Ser. No. 11/462,089. The paste may include silver particles capped with about 1-2% by weight capping agent or palladium particles capped with about 1-2% by weight capping agent or both. The capping agent may be hexadecylamine, dodecanethiol or other amine-based or thiol-based capping agents. The nanosilver-nanogold paste may be used to attach a die (or other electronic component) to a substrate. The nanosilver-nanopalladium particles may be present in a ratio of 1:1, 2:1, 1:2, respectively, or any ratio in between these ratios.

Example 11

A nanosilver-nanocopper-nanopalladium paste comprising silver particles, copper particles and palladium particles may be prepared as described in U.S. application Ser. No. 11/462,089. The paste may include silver particles capped with about 1-2% by weight capping agent or copper particles capped with about 1-2% by weight capping agent or palladium particles capped with about 1-2% by weight capping agent or all three. The capping agent may be hexadecylamine, dodecanethiol or other amine-based or thiol-based capping agents. The nanosilver-nanocopper-nanopalladium paste may be used to attach a die (or other electronic component) to a substrate. The nanosilver-nanocopper-nanopalladium particles may be present in a ratio of 1:1:1, 1:2:1, 1:1:2, respectively, or any ratio in between these ratios. In the attachment process, one or more of the sintering and/or drying steps may be performed in a nitrogen atmosphere.

Example 12

A nanosilver-nanogold-nanopalladium paste comprising silver particles, gold particles and palladium particles may be prepared as described in U.S. application Ser. No. 11/462,089. The paste may include silver particles capped with about 1-2% by weight capping agent or gold particles capped with about 1-2% by weight capping agent or palladium particles capped with about 1-2% by weight capping agent or all three. The capping agent may be hexadecylamine, dodecanethiol or other amine-based or thiol-based capping agents. The nanosilver-nanogold-nanopalladium paste may be used to attach a die (or other electronic component) to a substrate. The nanosilver-nanogold-nanopalladium particles may be present in a ratio of 1:1:1, 1:2:1, 1:1:2, respectively, or any ratio in between these ratios.

Example 13

A nanosilver-nanoplatinum-nanopalladium paste comprising silver particles, platinum particles and palladium particles may be prepared as described in U.S. application Ser. No. 11/462,089. The paste may include silver particles capped with about 1-2% by weight capping agent or platinum particles capped with about 1-2% by weight capping agent or palladium particles capped with about 1-2% by weight capping agent or all three. The capping agent may be hexadecylamine, dodecanethiol or other amine-based or thiol-based capping agents. The nanosilver-nanoplatinum-nanopalladium paste may be used to attach a die (or other electronic component) to a substrate. The nanosilver-nanoplatinum-nanopalladium particles may be present in a ratio of 1:1:1, 1:2:1, 1:1:2, respectively, or any ratio in between these ratios.

Example 14

A nanosilver-nanogold-nanocopper paste comprising silver particles, gold particles and copper particles may be prepared as described in U.S. application Ser. No. 11/462,089. The paste may include silver particles capped with about 1-2% by weight capping agent or gold particles capped with about 1-2% by weight capping agent or copper particles capped with about 1-2% by weight capping agent or all three. The capping agent may be hexadecylamine, dodecanethiol or other amine-based or thiol-based capping agents. The nanosilver-nanogold-nanocopper paste may be used to attach a die (or other electronic component) to a substrate. The nanosilver-nanogold-nanocopper particles may be present in a ratio of 1:1:1, 1:2:1, 1:1:2, respectively, or any ratio in between these ratios. In the attachment process, one or more of the sintering and/or drying steps may be performed in a nitrogen atmosphere.

When introducing elements of the examples disclosed herein, the articles "a," "an," and "the" are intended to mean that there are one or more of the elements. The terms "comprising," "including" and "having" are intended to be open ended and mean that there may be additional elements other than the listed elements. It will be recognized by the person of ordinary skill in the art, given the benefit of this disclosure, that various components of the examples can be interchanged or substituted with various components in other examples.

Although certain features, aspects, examples and embodiments have been described above, additions, substitutions, modifications, and alterations of the disclosed illustrative features, aspects, examples and embodiments will be readily recognized by the person of ordinary skill in the art, given the benefit of this disclosure.

What is claimed is:

1. A method of attaching a die to a substrate, the method comprising:
    disposing a paste comprising a capped nanomaterial on a substrate, wherein the capped nanomaterial comprises metal particles and a capping agent, the capped nanomaterial is dispersed in a solvent prior to disposition, and the solvent is selected from the group consisting of aliphatic alcohols having from 1 to 10 carbon atoms and aromatic compounds having aliphatic side chains that include 2-6 carbon atoms;
    disposing a die on the disposed capped nanomaterial; and
    sintering the capped nanomaterial at a temperature of 300° C. or less to attach the die to the substrate and form an electrical joint between the substrate and die.

2. The method of claim 1, further comprising drying the disposed capped nanomaterial prior to disposing the die on the disposed capped nanomaterial.

3. The method of claim 2, wherein the drying is conducted at a temperature in the range of from 5° C. to 200° C.

4. The method of claim 2, wherein the drying is conducted at a pressure less than atmospheric pressure.

5. The method of claim 2, wherein the solvent is removed from the substrate during the drying step.

6. The method of claim 2, wherein the substrate comprises a printed circuit board, a heat sink, semiconductor, or a power semiconductor.

7. The method of claim 1, wherein the capped nanomaterial is sintered at a temperature in the range of from 200° C. to 300° C.

8. The method of claim 1, wherein the capped nanomaterial is sintered under a pressure of from 0.2 to 20 MPa.

9. The method of claim 1, wherein the capped nanomaterial is sintered under a pressure of 5 MPa.

10. The method of claim 1, wherein the capped nanomaterial is sintered under a nitrogen atmosphere.

11. The method of claim 1, wherein the paste is free of a polymer.

12. The method of claim 1, wherein the metal particles comprise at least one transition metal.

13. The method of claim 1, wherein the metal particles comprise at least one metal selected from the group consisting of gold, silver, copper, nickel, platinum, palladium, iron, and alloys thereof.

14. The method of claim 1, wherein the metal particles comprise silver.

15. The method of claim 1, wherein the die comprises a semi-conducting material, a conductive material, a copper heat spreader, silver wire, a gold wire, a LED, a MEMS, or a combination thereof.

16. The method of claim 1, wherein the capping agent comprises an organic amine, a thiol, or a pyridine based capping agent.

17. The method of claim 1, wherein the capping agent comprises hexadecylamine.

18. The method of claim 1, wherein the capped nanomaterial comprises 15 weight percent or less of the capping agent.

19. The method of claim 1, wherein the capped nanomaterial comprises 1.5 weight percent to 2.5 weight percent capping agent.

20. The method of claim 1, wherein the capped nanomaterial is a nano-silver paste comprising 20 to 80 weight percent nano-silver particles, and up to 2 weight percent of a capping agent selected from the group consisting of organic amines having 12 or more carbon atoms, thiols having 12 or more carbon atoms, and pyridine-based capping agents; and
wherein the nano-silver paste is sintered at a temperature of 300° C. or less and at an applied pressure of 0.2 MPa to 20 MPa to provide an electrical joint between the substrate and the die and to attach the die to the substrate.

21. The method of claim 1 for packaging power semiconductors or power electronic applications.

22. The method of claim 1, wherein the substrate comprises alumina direct bond copper (DBC) and the die has a sputtered nickel/gold metallization layer.

23. The method of claim 1, wherein the capped nanoparticle comprises from 0.2 to 2.5 wt.% capping agent.

24. The method of claim 1, wherein the substrate has a length of 0.1 cm to 2 cm, a width of 0.1 cm to 2 cm and a thickness of 0.01 mm to 0.5 mm.

25. A method of attaching a die to a substrate, the method comprising:
disposing a paste comprising a capped nanomaterial on a substrate comprising a printed circuit board, wherein the capped nanomaterial comprises metal particles and a capping agent, the metal particles comprise at least one metal selected from the group consisting of gold, silver, copper, nickel, palladium, and alloys thereof, the capped nanomaterial is dispersed in a solvent prior to disposition, and the solvent selected from the group consisting of aliphatic alcohols having from 1 to 10 carbon atoms and aromatic compounds having aliphatic side chains that include 2-6 carbon atoms;
disposing a die on the disposed capped nanomaterial; and
sintering the capped nanomaterial at a temperature in the range of from 200° C. to 300° C. or less and at a pressure of from 0.2 MPa to 20 MPa to attach the die to the substrate and form an electrical joint between the substrate and die.

26. The method of claim 25, wherein the substrate comprises alumina direct bond copper (DBC) and the die has a sputtered nickel/gold metallization layer.

27. The method of claim 25, wherein the capped nanoparticle comprises from 0.2 to 2.5 wt.% capping agent.

28. The method of claim 25, wherein the substrate has a length of 0.1 cm to 2 cm, a width of 0.1 cm to 2 cm and a thickness of 0.01 mm to 0.5 mm.

* * * * *